(12) United States Patent
Wu

(10) Patent No.: US 12,132,076 B2
(45) Date of Patent: Oct. 29, 2024

(54) CAPACITANCE STRUCTURE AND FORMING METHOD THEREOF

(71) Applicant: CHANGXIN MEMORY TECHNOLOGIES, INC., Hefei (CN)

(72) Inventor: Ping-Heng Wu, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 422 days.

(21) Appl. No.: 17/579,851

(22) Filed: Jan. 20, 2022

(65) Prior Publication Data

US 2022/0149148 A1 May 12, 2022

Related U.S. Application Data

(63) Continuation of application No. PCT/CN2021/100740, filed on Jun. 17, 2021.

(30) Foreign Application Priority Data

Sep. 22, 2020 (CN) .......................... 202011001853.9

(51) Int. Cl.
*H01G 4/35* (2006.01)
*H01L 49/02* (2006.01)

(52) U.S. Cl.
CPC .............. *H01L 28/60* (2013.01); *H01G 4/35* (2013.01)

(58) Field of Classification Search
CPC ......... H01L 28/60; H01L 28/40; H01L 28/92; H01G 4/35; H01G 4/33; H01G 4/38; H10B 12/00; H10B 12/30; H10N 97/00
See application file for complete search history.

(56) References Cited

U.S. PATENT DOCUMENTS

| 5,285,110 | A | 2/1994 | Bae |
| 5,320,980 | A | 6/1994 | Bae |
| 6,136,695 | A | 10/2000 | Lee |
| 6,812,577 | B2 | 11/2004 | Lee |

(Continued)

FOREIGN PATENT DOCUMENTS

| CN | 1467826 A | 1/2004 |
| CN | 1204606 C | 6/2005 |

(Continued)

OTHER PUBLICATIONS

Supplementary European Search Report in the European application No. 21773256.9, mailed on Apr. 12, 2022, 9 pgs.

(Continued)

*Primary Examiner* — Mohammad A Rahman
(74) *Attorney, Agent, or Firm* — Kilpatrick Townsend & Stockton LLP

(57) ABSTRACT

A capacitance structure and a forming method thereof are provided, and the forming method includes: an annular gasket is formed on a substrate, and after a central through hole exposing a part of a surface of the substrate is formed in a center of the annular gasket, a first capacitance structure is formed in the central through hole; a dielectric layer covering the substrate, the annular gasket and the first capacitance structure is formed; the dielectric layer is etched to form an etching hole communicating with the central through hole in the dielectric layer; and a second capacitance structure connected to the first capacitance structure is formed in the etching hole.

20 Claims, 11 Drawing Sheets

(56) References Cited

U.S. PATENT DOCUMENTS

| | | | |
|---|---|---|---|
| 7,026,207 B2 | 4/2006 | Tsai | |
| 7,041,605 B2 | 5/2006 | Lee | |
| 7,259,087 B2 | 8/2007 | Jung | |
| 7,754,602 B2 | 7/2010 | Jeon | |
| 7,829,410 B2 | 11/2010 | Plum | |
| 8,039,377 B2 | 10/2011 | Plum | |
| 8,299,574 B2 | 10/2012 | Plum | |
| 8,372,724 B2 | 2/2013 | Takaishi | |
| 8,395,235 B2 | 3/2013 | Tsuchiya | |
| 8,871,633 B2 | 10/2014 | Fukasawa | |
| 9,076,804 B2 | 7/2015 | Liao et al. | |
| 9,230,966 B2 | 1/2016 | Sapra et al. | |
| 9,263,392 B1 | 2/2016 | Lin et al. | |
| 9,293,411 B2 | 3/2016 | Fukasawa | |
| 9,368,395 B1 | 6/2016 | Wei | |
| 9,425,142 B2 | 8/2016 | Fukasawa | |
| 9,627,359 B2 | 4/2017 | Fukasawa | |
| 9,859,214 B2 | 1/2018 | Fukasawa | |
| 9,871,052 B2 | 1/2018 | Lee | |
| 9,941,206 B2 | 4/2018 | Kang | |
| 9,978,677 B2 | 5/2018 | Liu | |
| 10,037,918 B2 | 7/2018 | Hsu et al. | |
| 10,157,837 B2 | 12/2018 | Fukasawa | |
| 10,504,839 B2 | 12/2019 | Fukasawa | |
| 10,622,305 B2 | 4/2020 | Kang | |
| 2004/0002189 A1 | 1/2004 | Park | |
| 2004/0046251 A1 | 3/2004 | Lee | |
| 2004/0197986 A1 | 10/2004 | Tsai | |
| 2004/0198008 A1 | 10/2004 | Tsai et al. | |
| 2004/0245650 A1 | 12/2004 | Lee | |
| 2005/0042878 A1 | 2/2005 | Jung | |
| 2009/0134491 A1* | 5/2009 | Plum | H10B 12/033 257/532 |
| 2010/0295110 A1 | 11/2010 | Takaishi | |
| 2011/0018098 A1 | 1/2011 | Plum | |
| 2011/0062552 A1 | 3/2011 | Tsuchiya | |
| 2012/0001299 A1 | 1/2012 | Plum | |
| 2013/0082401 A1 | 4/2013 | Fukasawa | |
| 2014/0210087 A1 | 7/2014 | Kang | |
| 2015/0008591 A1 | 1/2015 | Fukasawa | |
| 2015/0054163 A1 | 2/2015 | Liao et al. | |
| 2015/0294971 A1 | 10/2015 | Sapra et al. | |
| 2015/0357313 A1 | 12/2015 | Fukasawa | |
| 2016/0013191 A1 | 1/2016 | Sapra et al. | |
| 2016/0307877 A1 | 10/2016 | Fukasawa | |
| 2017/0110473 A1 | 4/2017 | Lee | |
| 2017/0117218 A1 | 4/2017 | Liu | |
| 2017/0207163 A1 | 7/2017 | Fukasawa | |
| 2018/0068899 A1 | 3/2018 | Tapily et al. | |
| 2018/0076126 A1 | 3/2018 | Fukasawa | |
| 2018/0090511 A1 | 3/2018 | Nakajima | |
| 2018/0151560 A1 | 5/2018 | Hsu et al. | |
| 2018/0197815 A1 | 7/2018 | Kang | |
| 2018/0294225 A1 | 10/2018 | Lee et al. | |
| 2019/0080997 A1 | 3/2019 | Fukasawa | |
| 2020/0006128 A1 | 1/2020 | Weng et al. | |
| 2020/0020711 A1 | 1/2020 | Liao | |
| 2020/0027827 A1 | 1/2020 | Lin et al. | |
| 2022/0093509 A1 | 3/2022 | Liu et al. | |
| 2022/0149148 A1 | 5/2022 | Wu | |

FOREIGN PATENT DOCUMENTS

| | | |
|---|---|---|
| CN | 1956184 A | 5/2007 |
| CN | 101874303 A | 10/2010 |
| CN | 103094186 A | 5/2013 |
| CN | 103972158 A | 8/2014 |
| CN | 104347345 A | 2/2015 |
| CN | 104425567 A | 3/2015 |
| CN | 104658962 A | 5/2015 |
| CN | 104979163 A | 10/2015 |
| CN | 106611742 A | 5/2017 |
| CN | 108122845 A | 6/2018 |
| CN | 108695336 A | 10/2018 |
| CN | 109037214 A | 12/2018 |
| CN | 109273430 A | 1/2019 |
| CN | 211017076 U | 7/2020 |
| KR | 20050066369 A | 6/2005 |
| KR | 20080093738 A | 10/2008 |
| WO | 2018063337 A1 | 4/2018 |

OTHER PUBLICATIONS

International Search Report in the international application No. PCT/CN2021/099873, mailed on Aug. 4, 2021, 3 pgs.
International Search Report in the international application No. PCT/CN2021/100740, mailed on Sep. 15, 2021, 3 pgs.
International Search Report in the international application No. PCT/CN2021/099878, mailed on Sep. 13, 2021 2 pgs.
International Search Report in the international application No. PCT/CN2021/100699, mailed on Aug. 31, 2021, 2 pgs.
United States Patent and trademark office, NFOA issued in related U.S. Appl. No. 17/578,509 on Jun. 13, 2024.

* cited by examiner

CAPACITANCE STRUCTURE AND FORMING METHOD THEREOF

CROSS-REFERENCE TO RELATED APPLICATIONS

This application is a continuation of International Application No. PCT/CN2021/100740, filed on Jun. 17, 2021, which claims priority to Chinese Patent Application No. 202011001853.9, filed on Sep. 22, 2020. The disclosures of International Application No. PCT/CN2021/100740 and Chinese Patent Application No. 202011001853.9 are hereby incorporated by reference in their entireties.

TECHNICAL FIELD

The disclosure relates to the field of semiconductors, and in particular to a capacitance structure and a forming method thereof.

BACKGROUND

As a commonly used semiconductor device in a computer, the Dynamic Random Access Memory (DRAM) is composed of multiple repetitive memory cells. Each memory cell usually includes a capacitor and a transistor. A gate of the transistor is connected to a word line, a drain of the transistor is connected with a bit line, and a source of the transistor is connected with the capacitor. Voltage signals on the word line can control the transistor to be turned on/off, and then data information stored in the capacitor may be read through the bit line, or data information may be written into the capacitor through the bit line for storage.

When the capacitor of the DARM is manufactured, it usually needs to form a capacitance hole exposing a target metal layer in a current dielectric layer, and then a capacitor structure is formed in the capacitance hole.

With increasingly high device integration, the aspect ratio of the capacitance hole formed in the dielectric layer is continuously improved, and formation of the capacitance hole with the high aspect ratio is always a great challenge for an etching process. When the capacitance hole with the high aspect ratio is formed, there is usually a problem of capacitance hole offset, so that the capacitor formed in the capacitance hole cannot be normally connected to the target metal layer, and the capacitance value of the current capacitor still needs to be improved.

SUMMARY

Embodiments of the disclosure provide a forming method for a capacitance structure, which includes the following operations. A substrate is provided. An annular gasket is formed on the substrate, where a central through hole exposing a part of a surface of the substrate is provided in a center of the annular gasket. A first capacitance structure is formed in the central through hole. A dielectric layer covering the substrate, the annular gasket and the first capacitance structure is formed. The dielectric layer is etched to form an etching hole communicating with the central through hole in the dielectric layer. A second capacitance structure connected to the first capacitance structure is formed in the etching hole.

The embodiments of the disclosure further provide a capacitance structure, which includes: a substrate, an annular gasket, a first capacitance structure, a dielectric layer, an etching hole and a second capacitance structure. The annular gasket is formed on the substrate where and a central through hole exposing a part of a surface of the substrate is provided in a center of the annular gasket. The first capacitance structure is located in the central through hole. The dielectric layer covers the substrate, the annular gasket and the first capacitance structure. The etching hole communicating with the central through hole is located in the dielectric layer. The second capacitance structure connected to the first capacitance structure is located in the etching hole.

DETAILED DESCRIPTION

As mentioned in the background, the capacitance hole offset is a common problem when forming the etching capacitance holes with the high aspect ratio.

Figure 1:
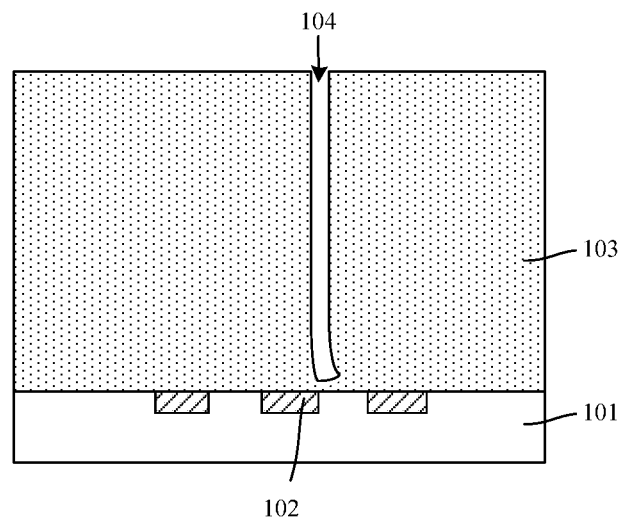
FIG. 1 is the structural schematic diagram of a currently formed capacitance hole.

It has found through research that, referring to FIG. 1, the magnetic field at the edge of a wafer has weaker bias voltage, so the bending of the etching capacitance hole 104 is easily caused, the bottom of the etching capacitance hole will be deviated from the normal position, and the surface of the target metal layer cannot be normally exposed. Or, due to the deviation of a carving process, the formed etching capacitance hole is deviated from the normal position, so the capacitor formed in the capacitance hole cannot be normally connected to the target metal layer.

Therefore, the disclosure provides a capacitance structure and a forming method thereof. The forming method includes: the annular gasket is formed on the substrate, and after the central through hole exposing the part of the surface of the substrate is formed in the center of the annular gasket, the first capacitance structure is formed in the central through hole. The dielectric layer covering the substrate, the annular gasket and the first capacitance structure is formed. The dielectric layer is etched to form the etching hole communicating with the central through hole in the dielectric layer, and the second capacitance structure connected to the first capacitance structure is formed in the etching hole. By forming the annular gasket, when forming the etching hole in the dielectric layer, and bending or position offset occurs to the etching hole, the annular gasket can prevent side etching at the bottom of the etching hole, so that the bottom of the etching hole is guided to the central through hole among the annular gaskets. Therefore, the bottom of the etching hole is correctly guided to the correct position, the formed capacitance hole (including the communicated central through hole and the etching hole) can normally expose the surface of the target layer, and the capacitance structure formed in the capacitance hole can be normally and electrically connected to the target layer. Moreover, the existence of the annular gasket can prevent the abnormal electrical leakage caused by metal diffusion brought by the formation of the first capacitor structure in the central through hole. Moreover, the first capacitance structure may be also formed in the central through hole in a center of the annular gasket, the etching hole in the dielectric layer may be formed with the second capacitance structure connected to the first capacitance structure, the central through hole and the etching hole form the capacitance hole, the first capacitance structure and the second capacitance structure may be serially connected to form the capacitor, so that the capacitance value of the capacitor formed in the capacitance hole is increased. Since the capacitor is formed in two steps (forming the second capacitance structure after forming the first capacitance structure), the difficulty of forming the capacitor in the capacitance hole with the high aspect ratio is reduced (it is typically of great difficulty to form the high-quality electrode layer and dielectric layer in a capacitance hole with a high aspect ratio).

In order to make the abovementioned purposes, features and advantages of the disclosure more obvious and understandable, the specific implementation mode of the disclosure will be clearly and completely described below in combination with the drawings. When describing the embodiments of the disclosure in details, for easy description, the schematic diagram is partially enlarged beyond the general proportion, and moreover, the schematic diagram is only an example, and the protection scope of the disclosure shall not be limited herein. In addition, the three-dimensional space size of the length, width and depth shall be included in actual manufacturing.

Figure 2:
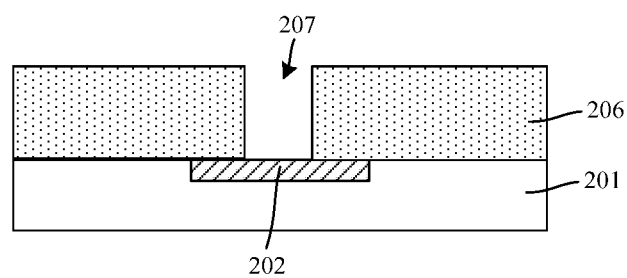
FIG. 2 to FIG. 11 are cross-sectional diagrams of a forming process for a capacitance structure according to embodiments of the disclosure.

Referring to FIG. 2, a substrate 201 is provided, a target layer 202 is formed in the substrate 201, and the substrate 201 exposes the surface of the target layer 202.

In an embodiment, the substrate 201 may be a semiconductor substrate, and the target layer 202 may be a doping area (for example, an area doped with N-type impurity ions or P-type impurity ion) located in the semiconductor substrate or a metal silicide area (for example, a nickel silicide area or a cobalt silicide area) located in the semiconductor substrate. A material of the semiconductor substrate may be Silicon (Si), Germanium (Ge), Silicon-Germanium (GeSi), Silicon Carbide (SiC), or Silicon On Insulator (SOI), Germanium On Insulator (GOI), or other materials, such as gallium arsenide and III-V compound. In other embodiments, the target layer may not be formed in the substrate 201, and the annular gasket is subsequently and directly formed on the surface of the substrate.

In other embodiments, the substrate 201 may include a semiconductor substrate and an interlayer dielectric layer located in the semiconductor substrate, and the target layer 202 is located in the interlayer dielectric layer. The interlayer dielectric layer may be a single-layer or multi-layer piling structure, the target layer 202 may be a metal layer, and the metal layer may be connected to a conductive structure (for example, a conductive plug) formed in a lower-layer dielectric layer.

A surface of the target layer 202 may be flush with a top surface of the substrate 201, or slightly higher than the top surface of the substrate 102.

One or more target layers 202 (greater than or equal to two) may be formed in the substrate 201, when there are a plurality of target layers 202, the adjacent target layers are independent, and in this embodiment, only one target layer 202 in the substrate 201 is taken as an example for illustration.

The target layer 202 needs to form the annular gasket subsequently. In an embodiment, still referring to FIG. 2, the mask material layer 206 is formed on the substrate 201 and remaining parts of the surface of the target layer 202, and a through hole 207 exposing the part of the surface of the target layer 202 is formed in the mask material layer 206.

A material of the mask material layer 206 may be any one or more of photoresist, silicon nitride, silicon oxide, silicon carbon nitride, silicon oxynitride, polycrystalline silicon, amorphous silica, amorphous carbon or low-K dielectric material. The forming process of the mask material layer 206 may be a chemical vapor deposition process.

In an embodiment, a material of the mask material layer 206 is the photoresist, and the through hole 207 is formed in the mask material layer 206 through exposure and development processes. When the mask material layer 206 is other materials, and the through hole 207 may be formed in the mask material layer 206 through an etching process.

The shape and the position of the through hole 207 define the shape and the position of the annular gasket subsequently formed.

Figure 3:
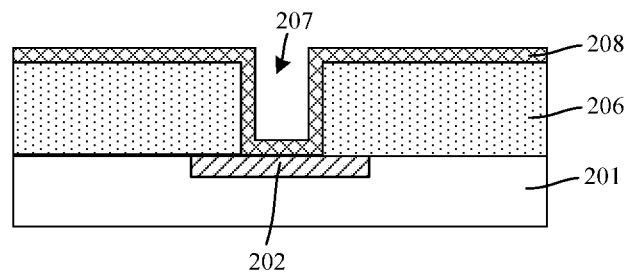

Referring to FIG. 3, the gasket material layer 208 is formed on a side wall and a bottom surface of the through hole 207 as well as a surface of the mask material layer 206.

The gasket material layer 208 is subsequently configured to form the annular gasket. A material of the gasket material layer 208 is different from a material of the dielectric layer subsequently formed. When subsequently forming the etching hole in the dielectric layer, the dielectric layer has higher etching selection ratio relatively to the annular gasket, so that the annular structure can effectively prevent the side etching when forming the through hole by etching the dielectric layer, and the bottom of the etching hole is more effectively guided to the central through hole.

A material of the annular gasket material layer 208 may be one or more of silicon nitride, silicon oxide, silicon carbon nitride or silicon oxynitride. In this embodiment, a material of the annular gasket material layer 208 is silicon nitride, and the annular gasket material layer is formed by adopting the chemical vapor deposition process.

The thickness of the gasket material layer 208 decides the width of the annular gasket subsequently formed. In an embodiment, the thickness of the gasket material layer 208 is 5 nm-5 um.

Figure 4:
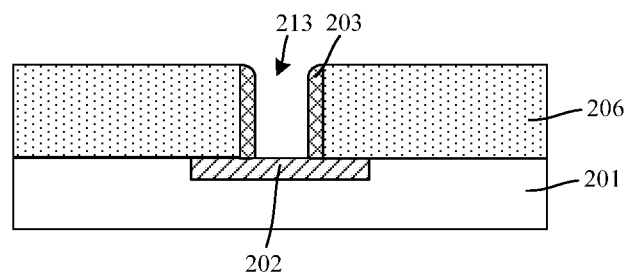

Referring to FIG. 4, the gasket material layer on the surface of the mask material layer 206 and the bottom surface of the through hole is removed by mask-free etching, so as to form the annular gasket 203 on the side wall surface of the through hole, where the central through hole 213 is formed in a center of the annular gasket 203.

By forming the annular gasket 203, when the etching hole is subsequently formed in the dielectric layer, and bending or position offset occurs to the etching hole, the annular gasket can prevent side etching at the bottom of the etching hole, so that the bottom of the etching hole is guided to the central through hole among the annular gaskets. Therefore, the bottom of the etching hole is correctly guided to the correct position, the formed capacitance hole (including the communicated central through hole and the etching hole) can normally expose the surface of the target layer, and the capacitance structure formed in the capacitance hole can be normally and electrically connected to the target layer. Moreover, the existence of the annular gasket can prevent the abnormal electrical leakage caused by metal diffusion brought by the subsequent formation of the first capacitor structure in the central through hole. Moreover, the first capacitance structure may be also subsequently formed in the central through hole in a center of the annular gasket, the etching hole in the dielectric layer may be subsequently formed with the second capacitance structure connected to the first capacitance structure, the central through hole and the etching hole form the capacitance hole, and the first capacitance structure and the second capacitance structure form a capacitor. The first capacitance structure may be serially connected to the second capacitance structure, so that the capacitance value of the capacitor formed in the capacitance hole is increased. Since the capacitor is formed in two steps (forming the second capacitance structure after forming the first capacitance structure), the difficulty of forming the capacitor in the capacitance hole with the high aspect ratio is reduced (it is typically of great difficulty to form the high-quality electrode layer and dielectric layer in a capacitance hole with a high aspect ratio). The gasket material layer is etched by adopting various heterogeneous dry etching processes, which may be a plasma etching process.

Figure 5:
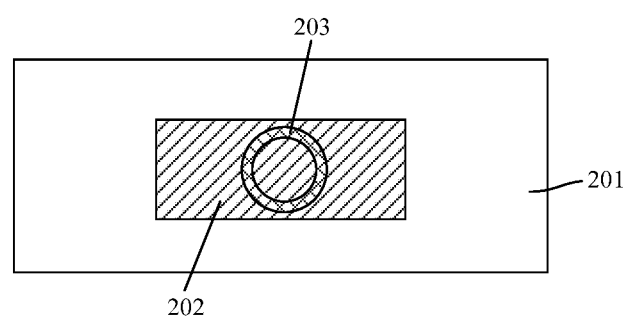
Figure 6:
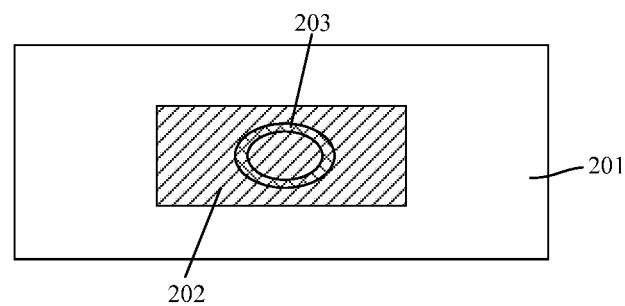

Referring to FIG. 5 and FIG. 6, which are the schematic diagrams of a look-down structure of an annular gasket 203 formed above. The shape of the annular gasket 203 shown in FIG. 5 is circular ring, and the shape of the annular gasket 203 shown in FIG. 6 is elliptical ring. In other embodiments, the shape of the annular gasket 203 may be rectangular ring. An inner diameter of the annular gasket 203 may be greater than or equal to s diameter of the etching hole subsequently formed in the dielectric layer. When the etching hole exists bending, the bottom of the etching hole is easier to be guided to the central through hole in a center of the annular gasket 203. In other embodiments, the outer diameter of the annular gasket may be less than the diameter of the etching hole subsequently formed in the dielectric layer.

Figure 7:
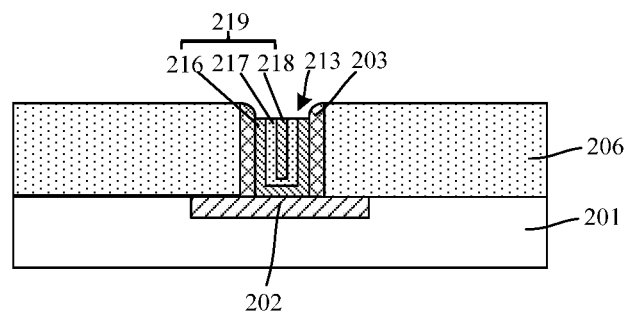

Referring to FIG. 7, which is performed based on FIG. 4, and the first capacitance structure 219 is formed in the central through hole 213.

In an embodiment, the first capacitance structure 219 includes first electrode layer 216 located on a side wall and a bottom surface of the central through hole 213, the first dielectric layer 217 located on the first electrode layer 216 and the second electrode layer 218 located on the first dielectric layer 217.

A material of the first electrode layer 216 includes compounds formed by one or two of metal nitride and metal silicide, for example, titanium nitride, titanium silicide, titanium silicide and $TiSi_xN_y$.

A material of the first dielectric layer 217 is high-K dielectric material, so as to improve the capacitance value of the capacitor in a unit area. The high-K dielectric material includes any one of $ZrO_x$, $HfO_x$, $ZrTiO_x$, $RuO_x$, $SbO_x$ and $AlO_x$ or the lamination formed by more two of group composed of the above materials.

A material of the second electrode layer 218 includes any one of tungsten, titanium, nickel, aluminum, platinum, titanium nitride, N-type polycrystalline silicon, P-type polycrystalline silicon or the lamination formed by more two of group composed of the above materials, further includes compounds formed by one or two of metal nitride and metal silicide, for example, titanium nitride, titanium silicide, titanium silicide and $TiSi_xN_y$.

In an embodiment, the forming process of the first capacitance structure 219 includes: the first electrode material layer, the first dielectric material layer and the second electrode material layer are successively formed on a side wall and a bottom surface of the central through hole 213, the top surface of the annular gasket 203 and the surface of the mask material layer 206. The first electrode material layer, the first dielectric material layer and the second electrode material layer are flattened to expose the surface of the mask material layer 206 and the top surface of the annular gasket 203. The first capacitance structure 219 is formed in the central through hole 213, the first capacitance structure 219 includes the first electrode layer 216 located on a side wall and a bottom surface of the central through hole 213, the first dielectric layer 217 located on the first electrode layer 216 and the second electrode layer 218 located on the first dielectric layer 217, and a top surface of the formed first capacitance structure 219 is flush with a top surface of the annular gasket 203.

In an embodiment, after the first capacitance structure 219 is formed, the first capacitance structure 219 is etched back, so that the top surface of the first remaining capacitance structure 219 is lower than the bottom surface of the annular gasket, so that the annular gasket still has better guidance to the etching process of the etching hole when subsequently forming the etching hole in the dielectric layer.

Figure 8:
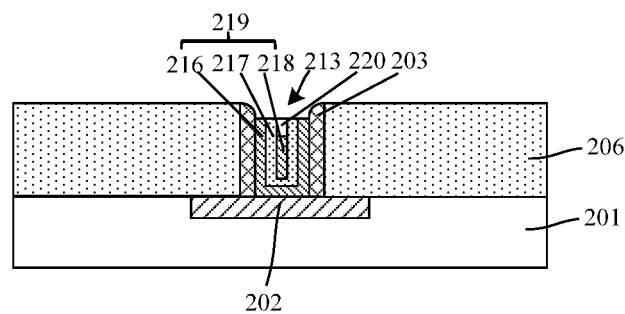

In an embodiment, referring to FIG. 8, after etching back the first capacitance structure 219, the second electrode layer 218 is etched back, so that a top surface of the second electrode layer 218 is lower than a top surface of the first electrode layer 216. An isolation layer 220 is formed on the second electrode layer 218 that is etched back, the isolation layer 220 does not cover the first electrode layer 216, and when subsequently forming the second capacitance structure in the etching hole, the third electrode layer of the second capacitance structure is electrically connected to the first electrode layer 216, the first capacitance structure is connected to the second capacitance structure in parallel, and the capacitance value of the capacitor formed in the capacitance hole is increased.

In an embodiment, the isolation layer may further cover the first electrode layer 216 and the annular gasket 203 and extend to the surface of the dielectric layer 217, and a rewiring metal layer may be formed in the isolation layer. One end of the rewiring metal layer is connected to the second electrode layer 218, and the other end passes through the isolation layer and extends to the surface of the dielectric layer. The fourth electrode layer of the second capacitance structure may be electrically connected to the second electrode layer of the first capacitance structure by subsequently manufacturing a metal plug on the dielectric layer at one side of the etching hole. Herein, the first electrode layer 216 and the third electrode layer of the second capacitance structure form an upper electrode of the capacitor, and the second electrode layer 218 and the fourth electrode layer of the second capacitance structure form a lower electrode of the capacitor.

A material of the isolation layer 220 is different from a material of the dielectric layer subsequently formed. Specifically, a material of the isolation layer 220 may be the same as a material of the annular gasket 203.

In other embodiments, after etching back the first capacitance structure 219, isolation side walls are provided on the surface of the first electrode layer 216 and the side wall surface of the central through hole 213. The isolation side walls do not cover the surface of the second electrode layer, after subsequently forming the etching hole connected to the central through hole in the dielectric layer and when forming the second capacitance structure in the etching hole, the third electrode layer of the second capacitance structure is electrically connected to the second electrode layer of the first capacitance structure, namely, the first capacitance structure and the second capacitance structure that are formed in the capacitance hole are serially connected. The capacitor in the capacitance hole is formed in two steps (forming the second capacitance structure after firstly forming the first capacitance structure), so the difficulty of forming the capacitor in the capacitance hole with the high aspect ratio is reduced (it is typically of great difficulty to form the high-quality electrode layer and dielectric layer in a capacitance hole with a high aspect ratio).

Figure 9:
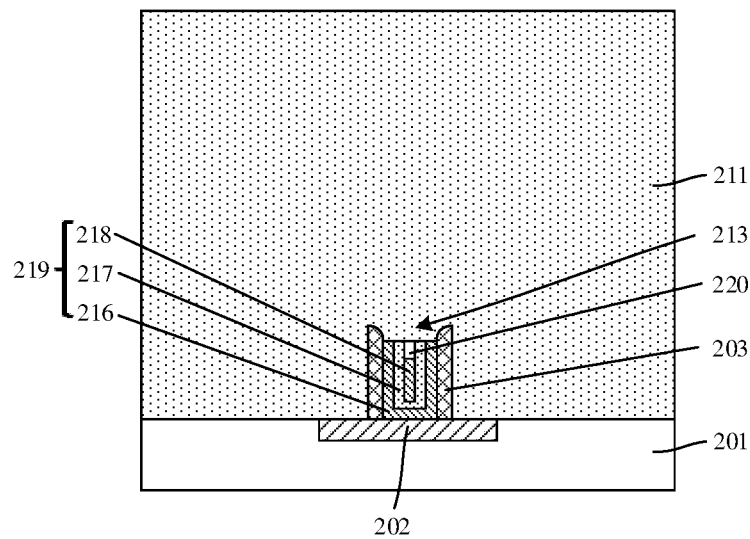

Referring to FIG. 9, the dielectric layer 211 covering the substrate 201, the target layer 202, the annular gasket 203 and the first capacitance structure 219 is formed.

In this embodiment, before the dielectric layer 211 is formed, the mask material layer 206 (referring to FIG. 8) is removed by a wet etching process. After removing the mask material layer, the dielectric layer 211 covering the substrate 201, the target layer 202, the annular gasket 203 and the first capacitance structure 219 is formed.

In another embodiment, when the mask material layer 206 is the isolation material, the mask material layer 206 may be configured to the electric isolation among devices, for example, when the mask material layer has the same material with the dielectric layer subsequently formed, before the dielectric layer is formed, the mask material layer 206 is reserved. Subsequently, the dielectric layer 211 is directly formed on the mask material layer 206, an extra step for removing the mask material layer 206 is not required.

A material of the dielectric layer 211 may be silicon oxide, silicon nitride, silicon oxynitride, Fluorine-doped Silica Glass (FSG), material with low dielectric constant, other suitable materials and/or the combination of the above materials. The deposition process adopted for forming the dielectric layer 211 may be Chemical Vapour Deposition (CVD), Plasma Enhanced Chemical Vapor Deposition (PECVD), Thermal CVD, High Density Plasma Chemical Vapour Deposition (HDPCVD) or atomic layer deposition.

Figure 10:
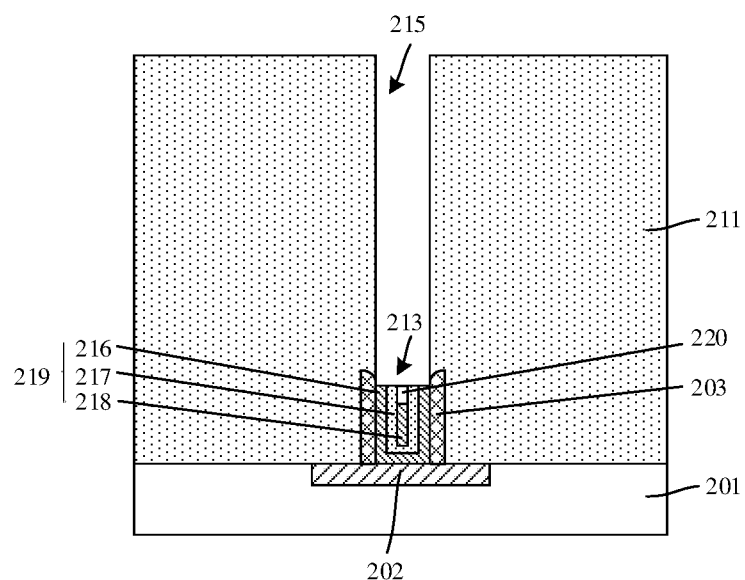

Referring to FIG. 10, the dielectric layer 211 is etched, the etching hole 215 communicating with the central through hole 213 is formed in the dielectric layer 211, and the etching hole 215 and the central through hole 213 form the capacitance hole.

Various heterogeneous dry etching processes adopted for forming the etching hole 215 by etching the dielectric layer 211 may be various heterogeneous plasma etching processes. The formed etching hole 215 may expose all or part of the first electrode layer 216.

In an embodiment, when the dielectric layer 211 is etched and when the formed etching hole 215 exists bending or overlay offset, the bended etching hole 215 can be guided to be connected to the central through hole 213 through the annular gasket 203. In this embodiment, the etching hole 215 is an etching hole without complete or overlay offset.

Figure 11:
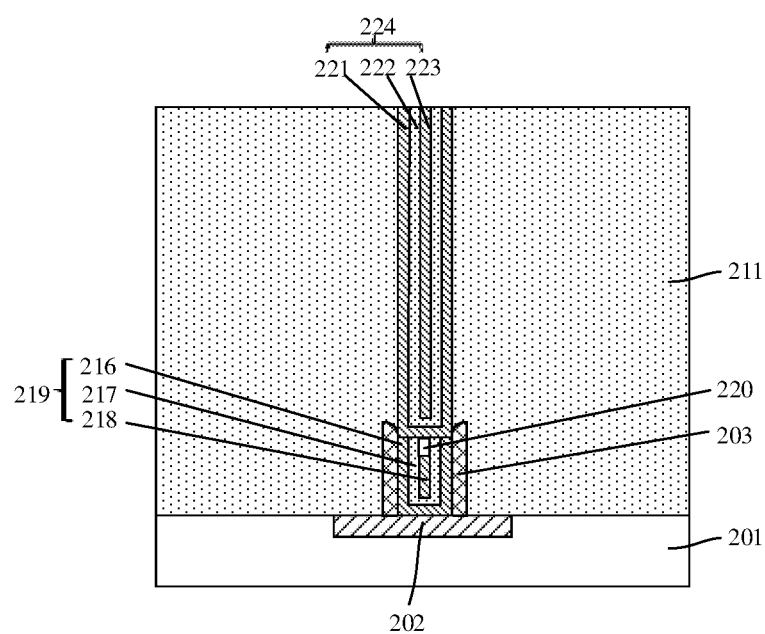

Referring to FIG. 11, the second capacitance structure 224 connected to the first capacitance structure 219 is formed in the etching hole 215 (referring to FIG. 10).

In an embodiment, the second capacitance structure 224 includes the third electrode layer 221 located on a side wall and a bottom of the etching hole, the second dielectric layer 222 located on the third electrode layer 221 and the fourth electrode layer 223 located on the second dielectric layer 222, namely, the formed first capacitance structure 219 is connected to the second capacitance structure 224 in parallel.

A material of the third electrode layer 221 includes compounds formed by one or two of metal nitride and metal silicide, for example, titanium nitride, titanium silicide, titanium silicide and TiSi$_x$N$_y$.

A material of the second dielectric layer 222 is high-K dielectric material, so as to improve the capacitance value of the capacitor in a unit area. The high-K dielectric material includes any one of ZrO$_x$, HfO$_x$, ZrTiO$_x$, RuO$_x$, SbO$_x$ and AlO$_x$ or the lamination formed by more two of group composed of the above materials.

A material of the fourth electrode layer 223 includes any one of tungsten, titanium, nickel, aluminum, platinum, titanium nitride, N-type polycrystalline silicon, P-type polycrystalline silicon or the lamination formed by more two of group composed of the above materials, further includes compounds formed by one or two of metal nitride and metal silicide, for example, titanium nitride, titanium silicide, titanium silicide and TiSi$_x$N$_y$.

In an embodiment, the forming process of the second capacitance structure 224 includes: the third electrode material layer, the second dielectric material layer and the fourth electrode material layer are successively formed on a side wall and a bottom surface of the etching hole 215 and the surface of the dielectric layer 211. The third electrode material layer, the second dielectric material layer and the fourth electrode material layer are flattened to expose the surface of the dielectric layer 211. The second capacitance structure 224 is formed in the etching hole, the second capacitance structure 224 includes the third electrode layer 221 located on a side wall and a bottom surface of the etching hole, the second dielectric layer 222 located on the third electrode layer 221 and the fourth electrode layer 223 located on the second dielectric layer 222, and the third electrode layer 221 is electrically connected to the first electrode layer 216.

It needs to be noted that one etching hole and one corresponding central through hole communicating with the one etching hole are taken as an example in the previous embodiments. One first capacitance structure is formed in one central through hole, and one second capacitance structure is formed in the etching hole. In other embodiments, one etching hole communicates with a plurality of corresponding central through holes, one first capacitance structure is correspondingly formed in each central through hole, and one second capacitance structure is formed in one etching hole. In another embodiment, a plurality of etching holes communicate with one corresponding central through hole, one first capacitance structure is formed in each central through hole, and one second capacitance structure is formed in each of the etching holes.

An embodiment of the disclosure further provides a capacitance structure. Referring to FIG. 10 and FIG. 11, the capacitance structure includes a substrate 201, an annular gasket 203, a first capacitance structure 219, a dielectric layer 211, an etching hole 215 and a second capacitance structure 224.

A target layer 202 is formed in the substrate 201, and the substrate 201 exposes the surface of the target layer 202.

The annular gasket 203 is located on the surface of the target layer 202, and the central through hole 213 exposing a part of the surface of the target layer 202 is provided in a center of the annular gasket 203.

The first capacitance structure 219 is located in the central through hole 213.

The dielectric layer 211 covers the substrate 201, the target layer 202, the annular gasket 203 and the first capacitance structure 219.

The etching hole 215 communicating with the central through hole 213 is located in the dielectric layer 211.

The second capacitance structure 224 connected to the first capacitance structure 219 is located in the etching hole 215.

In an embodiment, a material of the annular gasket 203 is different from a material of the dielectric layer 211, and when the dielectric layer 211 is etched to form the etching hole 215 communicating with the central through hole 213, the etching rate of the dielectric layer 211 is greater than an etching rate of the annular gasket 204.

In an embodiment, the top surface of the first capacitance structure 219 is lower than the bottom surface of the annular gasket 203.

In an embodiment, the first capacitance structure 219 includes the first electrode layer 216 located on a side wall and a bottom surface of the central through hole, the first dielectric layer 217 located on the first electrode layer 216 and the second electrode layer 218 located on the first dielectric layer 217.

In an embodiment, the second capacitance structure 224 includes the third electrode layer 221 located on a side wall and a bottom of the etching hole, the second dielectric layer 222 located on the third electrode layer 221 and the fourth electrode layer 223 located on the second dielectric layer 222. The third electrode layer 221 is electrically connected to the first electrode layer 216. Correspondingly, the isolation layer 220 is formed on the surface of the second electrode layer 218.

In another embodiment, the second capacitance structure includes the third electrode layer located on a side wall and a bottom of the etching hole, the second dielectric layer located on the third electrode layer and the fourth electrode layer located on the second dielectric layer. The third electrode layer is electrically connected to the second electrode layer of the first capacitance structure. Correspondingly, the capacitance structure further includes the isolation side wall that is formed on the surface of the first electrode layer and the side wall surface of the central through hole.

In an embodiment, an inner diameter of the annular gasket 203 is greater than or equal to a diameter of the etching hole 215.

In an embodiment, one etching hole communicates with one corresponding central through hole, one first capacitance structure is formed in one central through hole, and one second capacitance structure is formed in one etching hole; or, one etching hole communicates with a plurality of corresponding central through holes, one first capacitance structure is correspondingly formed in each central through hole, and one second capacitance structure is formed in one etching hole; or, a plurality of etching holes communicate with one corresponding central through hole, one first capacitance structure is formed in the central through hole, and one second capacitance structure is formed in each etching hole.

In other embodiments, the substrate 201 may be provided with different target layers, the annular gasket is directly located on the substrate, and the central through hole exposing a part of a surface of the substrate is provided in a center of the annular gasket.

It needs to be noted that the limitation or description for the similar or same structures in this embodiment (capacitance structure) and the previous embodiments (forming process of the capacitance structure) will not be defined in this embodiment, and specifically refer to the limitation or description for the corresponding part of the previous embodiments.

Although the disclosure has been disclosed with respect to preferred embodiments, it is not intended to limit the disclosure. Those skilled in any art may make possible change and modification by using the above disclosed method and technical contents without deviating from the spirit and scope of the disclosure. Therefore, any simple modification, equivalent change or modification made to the above embodiments according to the technical substance of the application, which is not separated from the contents of the technical solution of the disclosure, shall fall within the protection scope of the technical solution of the disclosure.

The invention claimed is:

1. A forming method for a capacitance structure, comprising:
providing a substrate, and forming an annular gasket on the substrate, wherein a central through hole exposing a part of a surface of the substrate is provided in a center of the annular gasket;
forming a first capacitance structure in the central through hole;
forming a dielectric layer covering the substrate, the annular gasket and the first capacitance structure;
etching the dielectric layer to form an etching hole communicating with the central through hole in the dielectric layer; and
forming a second capacitance structure connected to the first capacitance structure in the etching hole.

2. The forming method for a capacitance structure of claim 1, wherein a material of the annular gasket is different from a material of the dielectric layer, and when the dielectric layer is etched to form the etching hole communicating with the central through hole, an etching rate of the dielectric layer is greater than an etching rate of the annular gasket.

3. The forming method for a capacitance structure of claim 1, wherein a target layer is formed in the substrate that exposes a surface of the target layer, the annular gasket is formed on the surface of the target layer, and the central through hole exposes a part of the surface of the target layer.

4. The forming method for a capacitance structure of claim 3, wherein forming the annular gasket comprises: forming a mask material layer on the substrate and remaining parts of the surface of the target layer, and forming a through hole exposing the part of the surface of the target layer in the mask material layer; forming a gasket material layer on a side wall and a bottom surface of the through hole as well as a surface of the mask material layer; removing the gasket material layer on the surface of the mask material layer and the bottom surface of the through hole by mask-free etching, so as to form the annular gasket on a surface of the side wall of the through hole, the central through hole being provided in the center of the annular gasket; and after the first capacitance structure is formed, removing the mask material layer.

5. The forming method for a capacitance structure of claim 1, wherein a top surface of the first capacitance structure is lower than a top surface of the annular gasket.

6. The forming method for a capacitance structure of claim 1, wherein the first capacitance structure comprises a first electrode layer located on a side wall and a bottom surface of the central through hole, a first dielectric layer located on the first electrode layer and a second electrode layer located on the first dielectric layer.

7. The forming method for a capacitance structure of claim 5, wherein the second capacitance structure comprises a third electrode layer located on a side wall and a bottom of the etching hole, a second dielectric layer located on the third electrode layer and a fourth electrode layer located on the second dielectric layer; and the third electrode layer is electrically connected to a first electrode layer.

8. The forming method for a capacitance structure of claim 5, wherein before the second capacitance structure is formed, an isolation layer is formed on a surface of a second electrode layer.

9. The forming method for a capacitance structure of claim 5, wherein the second capacitance structure comprises a third electrode layer located on a side wall and a bottom of the etching hole, a second dielectric layer located on the third electrode layer and a fourth electrode layer located on the second dielectric layer; and the third electrode layer is electrically connected to a second electrode layer.

10. The forming method for a capacitance structure of claim 9, wherein before the second capacitance structure is formed, an isolation side wall is formed on a surface of a first electrode layer and a surface of a side wall of the central through hole.

11. The forming method for a capacitance structure of claim 1, wherein an inner diameter of the annular gasket is greater than or equal to a diameter of the etching hole.

12. The forming method for a capacitance structure of claim 1, wherein one etching hole communicates with one corresponding central through hole, one first capacitance structure is formed in one central through hole, and one second capacitance structure is formed in one etching hole; or, one etching hole communicates with a plurality of corresponding central through holes, one first capacitance structure is correspondingly formed in each central through hole, and one second capacitance structure is formed in one etching hole; or, a plurality of etching holes communicate with one corresponding central through hole, one first capacitance structure is formed in the central through hole, and one second capacitance structure is formed in each etching hole.

13. A capacitance structure, comprising:
a substrate;
an annular gasket, which is formed on the substrate, and a central through hole exposing a part of a surface of the substrate is provided in a center of the annular gasket;
a first capacitance structure, which is located in the central through hole;
a dielectric layer, which covers the substrate, the annular gasket and the first capacitance structure;
an etching hole, which communicates with the central through hole and is located in the dielectric layer; and
a second capacitance structure, which is connected to the first capacitance structure and located in the etching hole.

14. The capacitance structure of claim 13, wherein a material of the annular gasket is different from a material of the dielectric layer, and when the dielectric layer is etched to form the etching hole communicating with the central through hole, an etching rate of the dielectric layer is greater than an etching rate of the annular gasket.

15. The capacitance structure of claim 13, wherein a target layer is formed in the substrate that exposes a surface of the target layer, the annular gasket is formed on the surface of the target layer, and the central through hole exposes a part of the surface of the target layer.

16. The capacitance structure of claim 13, wherein a top surface of the first capacitance structure is lower than a top surface of the annular gasket.

17. The capacitance structure of claim 13, wherein, the first capacitance structure comprises a first electrode layer located on a side wall and a bottom surface of the central through hole, a first dielectric layer located on the first electrode layer and a second electrode layer located on the first dielectric layer.

18. The capacitance structure of claim 17, wherein the second capacitance structure comprises a third electrode layer located on a side wall and a bottom of the etching hole, a second dielectric layer located on the third electrode layer and a fourth electrode layer located on the second dielectric layer; and the third electrode layer is electrically connected to the first electrode layer.

19. The capacitance structure of claim 18, further comprising an isolation layer located on the surface of the second electrode layer.

20. The capacitance structure of claim 17, wherein the second capacitance structure comprises a third electrode layer located on a side wall and a bottom of the etching hole, a second dielectric layer located on the third electrode layer and a fourth electrode layer located on the second dielectric layer; and the third electrode layer is electrically connected to the second electrode layer.

* * * * *